United States Patent
Taguchi

(10) Patent No.: US 6,501,301 B2
(45) Date of Patent: Dec. 31, 2002

(54) SEMICONDUCTOR INTEGRATED CIRCUIT AND AN ELECTRONIC APPARATUS INCORPORATING A MULTIPLICITY OF SEMICONDUCTOR INTEGRATED CIRCUITS

(75) Inventor: Masahiko Taguchi, Kyoto (JP)

(73) Assignee: Rohm Co., Ltd., Kyoto (JP)

(*) Notice: Subject to any disclaimer, the term of this patent is extended or adjusted under 35 U.S.C. 154(b) by 0 days.

(21) Appl. No.: 09/945,064

(22) Filed: Aug. 30, 2001

(65) Prior Publication Data

US 2002/0027466 A1 Mar. 7, 2002

(30) Foreign Application Priority Data

Sep. 1, 2000 (JP) ........................................ 2000-265633

(51) Int. Cl.[7] ...................... H01L 25/00; H03K 19/0175
(52) U.S. Cl. .......................... 326/101; 326/81; 327/333
(58) Field of Search ............................ 326/80, 81, 101, 326/47; 327/333

(56) References Cited

U.S. PATENT DOCUMENTS 4,039,869 A * 8/1977 Goldman et al. ............ 307/279
5,352,942 A * 10/1994 Tanaka et al. .............. 307/475

* cited by examiner

Primary Examiner—Daniel D. Chang
(74) Attorney, Agent, or Firm—Hogan & Hartson LLP

(57) ABSTRACT

An electronic apparatus having a multiplicity of operably connected semiconductor integrated circuits (ICs) arranged on a substrate and operable at different operating voltages. The interface voltages between two ICs is set to the lowest operating voltage of the ICs. Each IC other than those operating at the lowest operating voltage has an input circuit for converting the lowest operating voltage of an input signal to its operating voltage and an output circuit for converting the voltage of its output signal to the lowest operating voltage.

2 Claims, 7 Drawing Sheets

SEMICONDUCTOR INTEGRATED CIRCUIT AND AN ELECTRONIC APPARATUS INCORPORATING A MULTIPLICITY OF SEMICONDUCTOR INTEGRATED CIRCUITS

FIELD OF THE INVENTION

The invention relates to an electronic apparatus incorporating a multiplicity of semiconductor integrated circuits (ICs) arranged on an substrate which operate at different operating voltages and a semiconductor IC for use in such electronic apparatus.

BACKGROUND OF THE INVENTION

Recent advance in semiconductor technology has enabled fabrication of large scale integrated (LSI) semiconductor circuits. The maximum allowable level of the operating voltage for such LSI is limited more than ever to a lower operating voltage, for example from conventional 5 Volts to 3 Volts or to an even lower voltage of 2 Volts. Besides, a multiplicity of LSIs used in an electronic apparatus often have different operating voltages. In order to allow transmission of signals between two LSIs running at two different operating voltages, an interface is required to adjust or absorb the difference in the operating voltages.

Conventionally, adjustment of the voltages is done by converting the lower operating voltage of one LSI to a higher voltage to match with the operating voltage of other conventional (mostly well established) LSI.

Consequently, for an electronic apparatus having a multiplicity of LSIs which are operated at different operating voltages, it is a common practice to raise the lower voltage (2 Volts for example) of the interface section of the LSIs to the higher operating voltage of the other LSI by making oxide layers of the gates thicker or making the channels longer, or by utilizing dedicated special transistors.

However, these resolutions inhibit high-degree integration of low voltage LSIs, sacrificing the merit of up-to-date large scale integration technology, and resulting in not only increase of chip areas but also additional complexity to the manufacturing processes, and hence increases production cost of the electronic apparatus.

SUMMARY OF THE INVENTION

In accordance with one aspect of the invention, there is provided an electronic apparatus incorporating a multiplicity of operably connected semiconductor integrated circuits (ICs) arranged on a substrate which operate at different operating voltages, wherein all the interface voltages between operably connected ICs are set to the lowest operating voltage.

Each of the ICs other than those operating at the lowest operating voltage is provided with:
   an input circuit for converting the lowest operating voltage of a signal input thereto from another IC to its own operating voltage; and
   an output circuit for converting the voltage of the signal to be output therefrom to the lowest operating voltage.

In accordance with another aspect of the invention, there is provided an electronic apparatus incorporating a multiplicity of operably connected semiconductor integrated circuits (ICs) arranged on a substrate which operate at different operating voltages, wherein
   the interface voltage between any two operably connected ICs operating at two operating voltages is the lower operating voltage of the two.

Each of the ICs other than those operating at the lower operating voltage is provided with:
   an input circuit for converting a lower operating voltage of a signal input thereto from another IC to its own operating voltage; and
   an output circuit for converting the voltage of the signal to be output therefrom to a required lower operating voltage.

In this arrangement, although the electronic apparatus incorporates a multiplicity of LSIs that operate at different operating voltages, the most highly integrated IC having the lowest operating voltage can be interfaced with its own operating voltage, so that the electronic apparatus can enjoy the merit of the large scale integration.

It is noted that those LSIs not operating at the lowest operating voltage can be interfaced with other LSIs at a lower voltage than their own operating voltages using input/output circuits.

Since the interfacing is done at a low voltage, energy loss due to electromagnetic interference (EMI) for example can be reduced accordingly.

If all the interface voltages for the operably connected LSIs are set to the lowest operating voltage of the LSIs, then all the LSIs can be interfaced through the their input and output circuits connected at the same lowest voltage, thereby simplifying the design of the input/output circuits.

When the interface voltage for any two operably connected LSIs operating at two different operating voltages is set to the lower one of the two, the LSI having a lower operating voltage needs no input circuit or output circuit, thereby advantageously reducing the number of input/output circuits.

DETAILED DESCRIPTION OF THE PREFERRED EMBODIMENT

What follows is a description of preferred embodiments of an electronic apparatus incorporating a multiplicity of LSIs and LSIs for use in such electronic apparatus in accordance with the invention, as shown in the accompanying drawings.

Figure 1:
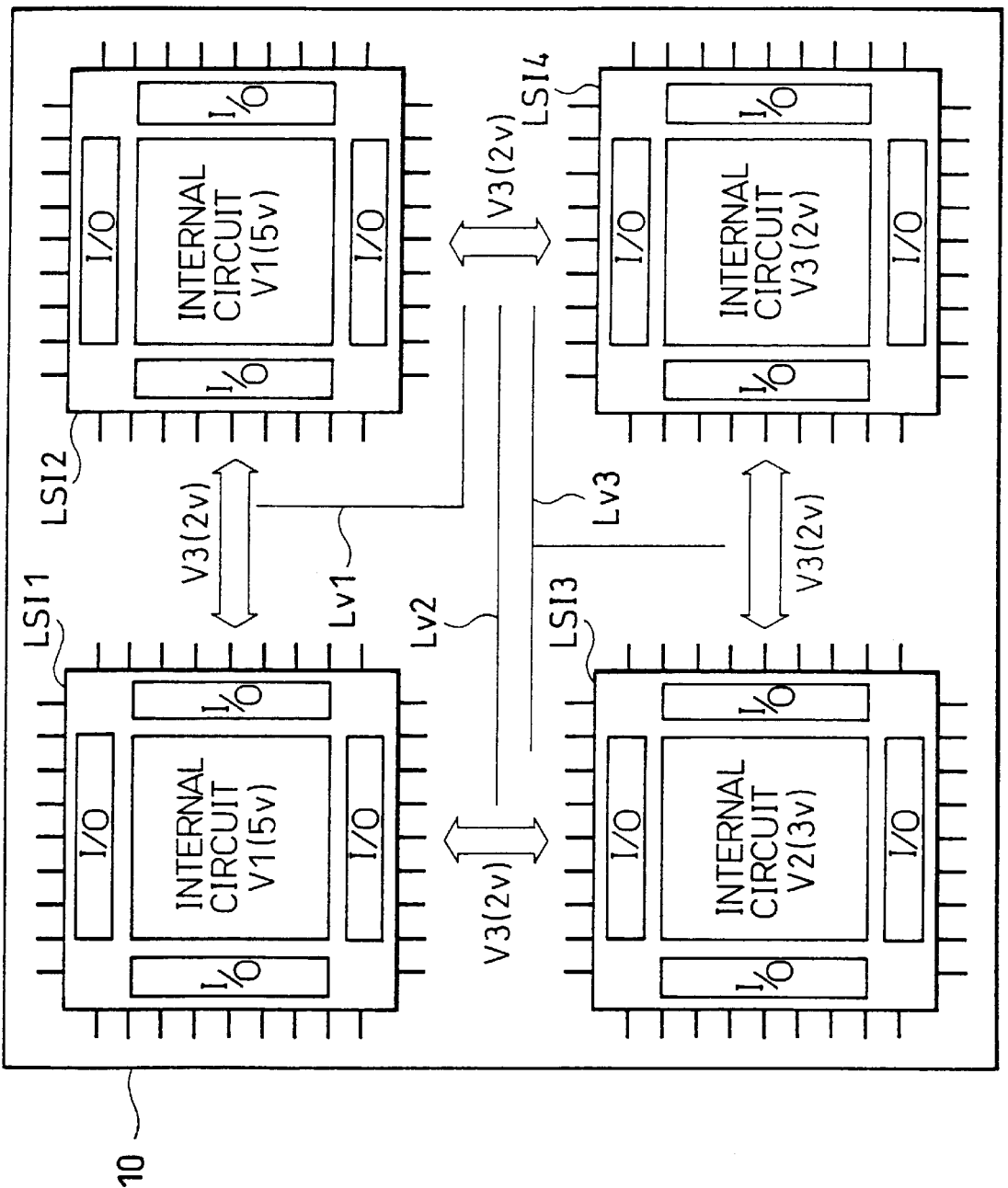
FIG. 1 is a schematic diagram of a first embodiment of an electronic apparatus incorporating a multiplicity of LSIs according to the invention.

Referring to FIG. 1, there is shown a first embodiment of an electronic apparatus incorporating a multiplicity of LSIs, illustrating the concept of the invention.

In FIG. 1, the electronic apparatus is shown to have four LSIs, indicated as LSI1, LSI2, LSI3, and LSI4, respectively, mounted on a substrate 10. These LSIs operate at respective operating voltages V1, V1, V2, and V3. In the example shown herein, V1 is 5 Volts; V2 is 3 Volts; and V3 is 2 Volts. However, the operating voltages of the LSIs are not limited in number to three, nor to the three voltages. Also, the number of the LSIs mounted on the substrate 10 is arbitrary. The number of the LSIs that operates at the same operating voltage is also arbitrary.

The substrate 10 is provided with power lines Lv1 (for 5 Volts), Lv2 (for 3 Volts), and Lv3 (for 2 Volts) for supplying each of the LSI on the substrate with the operating voltages V1, V2, and V3, respectively. Each of the LSIs, LSI1–LSI4, are coupled to the power lines to obtain power for its own operation and power for performing required interface with other LSIs.

In the example shown in FIG. 1, the interface voltage between any two LSIs on the substrate 10 is commonly set to the lowest operating voltage V3 (2 Volts).

Consequently, except for the LS14 that operates at the lowest operating voltage V3 (2 Volts), each of the LSIs requires an output circuit for converting its own operating voltage, V1 (5 Volts) or V2 (3 Volts), of the output signal to the lowest operating voltage V3, and an input circuit for converting the lowest voltage V1 of the input signal to their own operating voltage. These input/output circuits are provided in the respective input/output (I/O) interface circuits of each LSI.

Thus, advantageously the interface voltage for the most highly integrated LSI, LSI4, are set to the operating voltage of its own, so that the merit of large scale integration can be fully effected for the electronic apparatus.

It would be appreciated that, since all the interface voltages are set to the lowest voltage V3, radiative energy loss e.g. EMI can be reduced. Also, since all the input and output circuits of the LSI except for the one having the lowest operating voltage operate at the lowest operating voltage, design of the input and the output circuits is simple. Further, since the interface voltage is lower than the operating voltage of the LSI, the input and the output circuits may be easily provided in the LSI.

Figure 2:
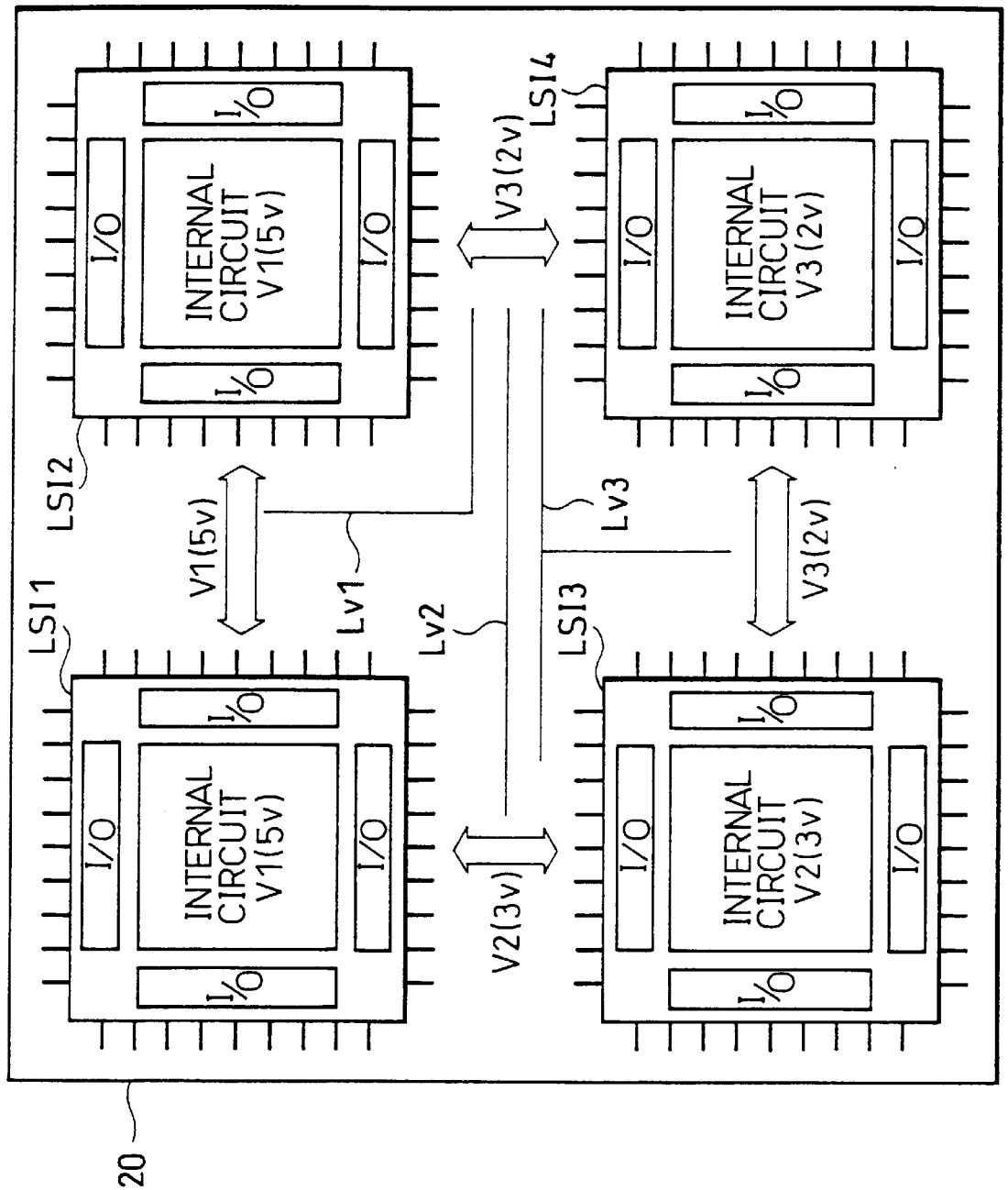
FIG. 2 is a schematic diagram of a second embodiment of an electronic apparatus incorporating a multiplicity of LSIs according to the invention.

FIG. 2 is a schematic diagram of a second embodiment of an electronic apparatus incorporating a multiplicity of LSIs according to the invention.

As in the first embodiment, the second embodiment is shown to have four LSIs LSI1–LSI4 mounted on a substrate 20 that operate at respective operating voltages V1, V1, V2, and V3 as shown in FIG. 2. In the example shown herein, V1 is 5 Volts; V2 is 3 Volts; and V3 is 2 Volts. However, the operating voltages of the LSIs are not limited in number to three, nor limited to these voltages. They can be all different. Also, the number of the LSIs mounted on the substrate 20 is arbitrary. The substrate 20 is provided with power lines Lv1 (for 5 Volts), Lv2 (for 3 Volts), and Lv3 (for 2 Volts) for supplying each of the LSI on the substrate with the operating voltages V1, V2, and V3, respectively. Each of the LSIs, LSI1–LSI4, are coupled to these power lines to obtain power for its own operation and for performing interface with other LSIs.

In the example shown in FIG. 2, the interface voltage between any two LSIs operating at two different voltages is set to the lower operating voltage of the two. Thus, the interface voltage for the LSI1 and LSI2 is taken as V1, which is the lower operating voltages of the two LSIs. Similarly, the interface voltage for the LSI1 and LSI3 is V2, and the interface voltage for the LSI1 and LSI4 is V3, as well as the interface voltage for the LSI3 and LSI4.

Hence, except for the LSI4 that operates at the lowest operating voltage V3 (2 Volts), the rest of the LSIs must have an input circuit to convert the interface voltage V2 (3 Volts) or V3 (2 Volts) to their (higher) operating voltages when the LSI receives an input signal from another LSI operating at a lower voltage, and/or an output circuit to convert the voltage of the signal they output to a lower interface voltage V2 or V3 when the LSI outputs the signal to another LSI operating at a lower operating voltage. These input/output circuits are provided in the respective I/O interface circuits of the respective LSIs.

Since the interface voltages between arbitrary two LSIs are set to the operating voltages of the two LSIs in the manner as described, the most highly integrated LSI, LSI4, can be interfaced with its own operating voltage V3 (2 Volts). Therefore, the merit of large scale integration can be fully effected in the electronic apparatus.

The fact that the interface voltage for the two LSIs is set to the lower one of the their operating voltages implies that the LSI having the lower operating voltage does not require an input/output circuit, thereby having less number of input and output circuits, as compared with the first embodiment.

Further, in the example shown herein, the interface voltage between a pair of two LSIs (other than the LSI4) operating at two different voltages is V2 or V3, which is lower than their operating voltages V1 or V2, respectively.

It would be understood that the electronic apparatus as shown in FIGS. 1 and 2 and an external electronic apparatus can be the interfaced by the lowest operating voltage V3 (2 Volts). It is also possible to use individual operating voltages V1–V3 in interfacing each of LSIs with an external LSI.

Figure 3:
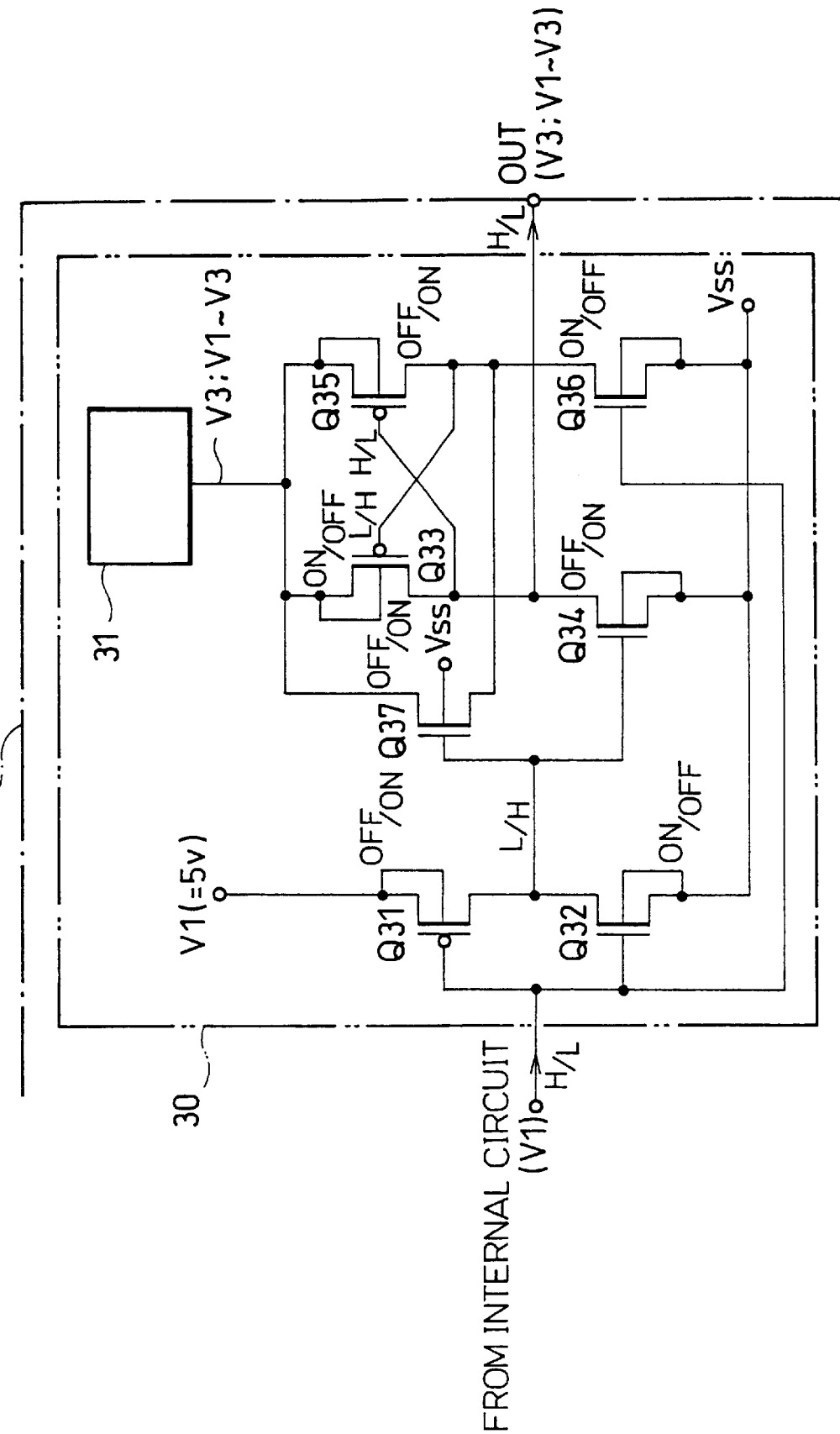
FIG. 3 is a circuit diagram of an I/O circuit of an output circuit.
Figure 4:
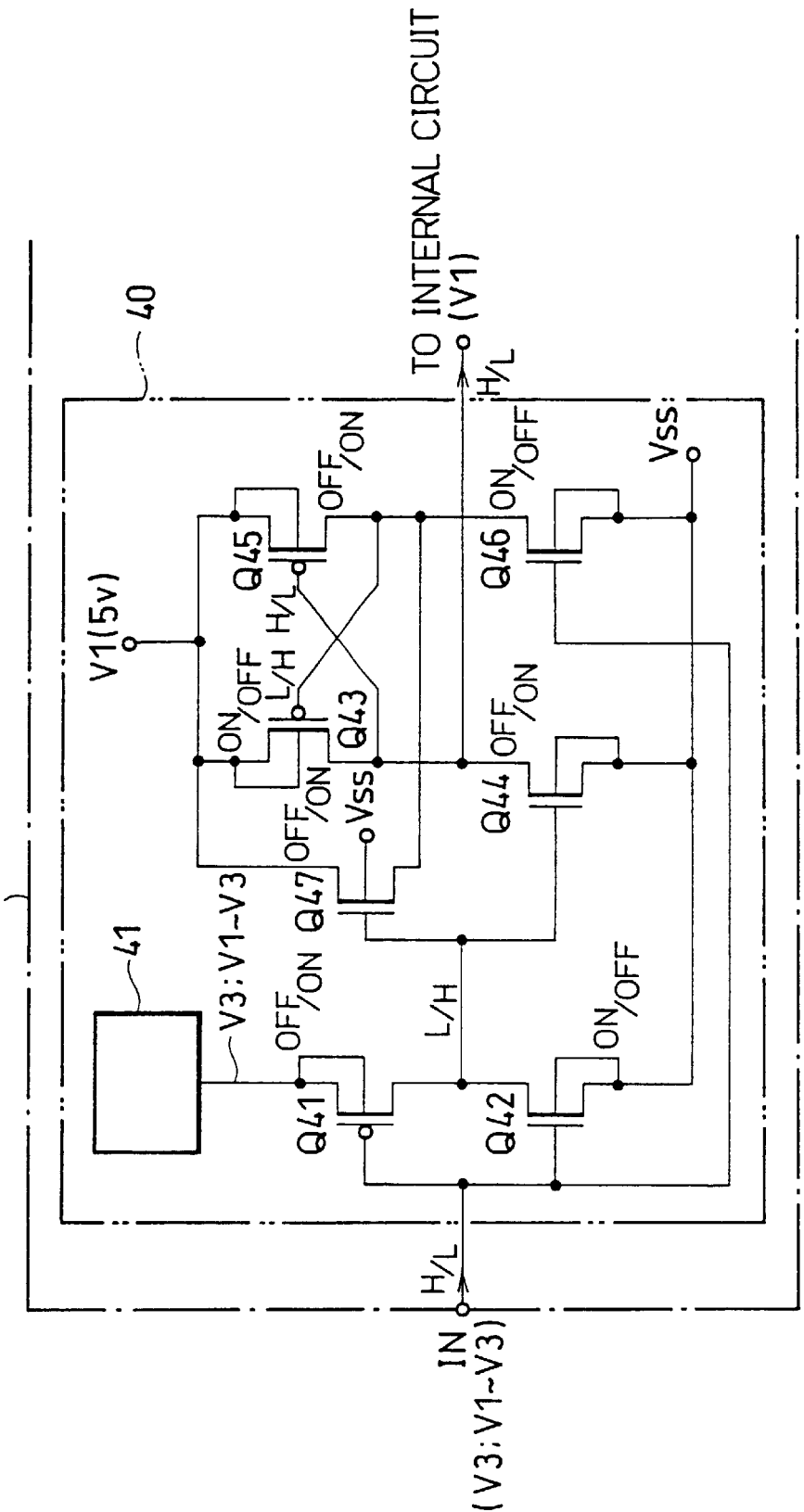
FIG. 4 is a circuit diagram of an I/O circuit of an input circuit.

As an example, FIGS. 3 and 4 illustrate an output circuit and an input circuit, respectively, formed in the I/O circuit of the LSI of FIGS. 1 and 2 other than those that runs at the lowest operating voltage V1. Although MOSFETs are used in the example shown in FIGS. 3 and 4, other types of switching elements such as bipolar transistors may be used equally well.

In the output circuit 30 shown in FIG. 3, transistors Q31–Q37 are MOSFETs. Of these, the transistors Q31, Q33, and Q35 each marked with a circle are P-channel MOSFETs. The rest are N-channel MOSFETs. The transistors Q31 and Q32 forming an inverter circuit is supplied with the operating voltage V1. An interface voltage supply circuit 31 is connected with a cross-linked circuit forming by transistors Q33–Q37, so that one of the three interface voltages V1–V3 is selectively supplied. Incidentally, in cases where the interface voltage of any LSI is the lowest operating voltage V3 (2 Volts), as in the first embodiment, the interface voltage supply circuit 31 outputs the lowest voltage V3.

The cross-linked circuit includes series transistors Q33 and Q34, which is connected in parallel with another set of series transistors Q35 and Q36, with the gate of the transistor Q33 connected to the node of the series transistors Q35 and Q36, and the gate of the transistor Q35 connected to the node of the series transistors Q33 and Q34. When the gates of the transistors Q34 and Q36 are supplied with an inverted signal and a non-inverted signal, respectively, the output signal is provided at the node of the series transistors Q33 and Q34. An auxiliary transistor Q37 is provided to accelerate the operating speed of the cross-linked circuit. The transistor Q37 is optional.

Suppose now that the output circuit 30 is provided with a high (H) level signal (referred to as signal H) of voltage V1 or a low (L) level signal (referred to as signal L) of voltage Vss (0 Volt) from an internal circuit. When signal H is supplied to input end of the output circuit 30, the transistor Q31 is turned OFF, and the transistor Q32 is turned ON, so that the transistor Q34 is turned OFF, while the transistor Q36 is turned ON. As a result, the cross-linked transistors Q33 and Q35 are turned ON and OFF, respectively. Thus, with the transistor Q33 turned ON and the transistor Q34 turned OFF, the voltage selected by the interface voltage supply circuit 31 from the operating voltages V1–V3 is supplied to the output node, so that the signal H having the selected operating voltage is output from the terminal OUT to other LSIs as the interface voltage therefor.

On the other hand, when signal L is supplied to the input end of the circuit 30, the transistor Q31 is turned ON, the transistor Q32 is turned OFF, so that the operating voltage V1 is supplied to the gate of the transistor Q34, turning ON the transistor Q34 and turning OFF the transistor Q36. As a result, the transistor Q33 is turned OFF, while the transistor Q35 is turned ON. Thus, with the transistor Q 33 turned OFF and the transistor Q34 turned ON, the signal L having the low level voltage Vss is output from the output terminal OUT to other LSIs, instead the voltage selected by the interface voltage supply circuit 31.

In the input circuit 40 shown in FIG. 4, transistors Q41–Q47 are MOSFETs. Of these, the transistors Q41, Q43, and Q45 each marked with a circle are P-channel MOSFETs. The rest are N-channel MOSFETs. The interface voltage supply circuit 41 is coupled with the gates of the transistors Q41 and Q42 forming an inverter circuit. One of the operating voltages V1–V3 specified by the signal externally input thereto is selectively output by the interface voltage supply circuit 41.

Incidentally, it is possible to have the interface voltage supply circuit 41 to provide only the lowest operating voltage V3 by feeding the lowest voltage V3 to the gates of the inverter transistors Q41 and Q42.

The cross-linked circuit formed of the transistors Q43–Q47 is supplied with the operating voltage V1 of the associated transistor, which is LSI1 in this example. The structure of the cross-linked circuit is identical to that of the output circuit shown in FIG. 3.

The input circuit 40 receives signal H or signal L from another LSI. The level of the input signal is the same as the lowest interface voltage V3 in the first embodiment, and is the same as one of the three voltages V1–V3 in the second embodiment depending on the LSI issuing that input signal.

In any event, given signal H, the transistor Q41 is turned OFF and the transistor Q42 is turned ON, so that the transistor Q44 is turned OFF and the Q46 is turned ON. The cross-linked transistors Q43 and Q45 are turned ON and OFF, respectively. Thus, with the transistor Q43 turned ON and the transistor Q44 turned OFF, signal H is given the operating voltages V1 as it is fed to the internal circuit of the LSI1.

On the other hand, when signal L is supplied to the input circuit 40, the transistor Q41 is turned ON and the transistor Q42 is turned OFF, so that the operating voltage set by the interface voltage supply circuit 41 (V3; V1–V3) is supplied to the gate of the transistor Q44, turning ON the transistor Q44 and turning OFF the transistor Q46. As a result, the cross-linked transistors Q43 and Q45 are turned OFF and ON, respectively. Thus, with the transistor Q43 turned OFF and the transistor Q44 turned ON, the signal L having the low voltage Vss is supplied to the internal circuit.

In this way, the invention provides the input circuit as shown in FIG. 3 and the output circuit as shown in FIG. 4 to every LSI (LSI1–LSI3) except for the LSI4 having the lowest operating voltage V3. Thus, all the LSIs (other than LSI4) are interfaced by a lower voltage (V2 or V3) than their operating voltages (V1 or V2), so that provision of such input circuit and/or output circuit in the LSIs is relatively easy.

If the interface voltage between two LSIs were established at a higher operating voltage, as is the case with conventional LSIs, at least the transistors Q33–Q37 (FIG. 3) of the output circuit of an LSI (e.g. LSI operating at V3 (2 Volts)) for example should be resistible against a high voltage, and at least the transistors Q41, Q42, and Q46 (FIG. 4) of the input circuit of an LSI (e.g. LSI operating at V3 (2 Volts) ) should be resistible against a high voltage, which requires changes in manufacturing process to form thicker or larger oxide layers of the gates of these transistors, thereby adding extra complexity and cost.

Figure 5:
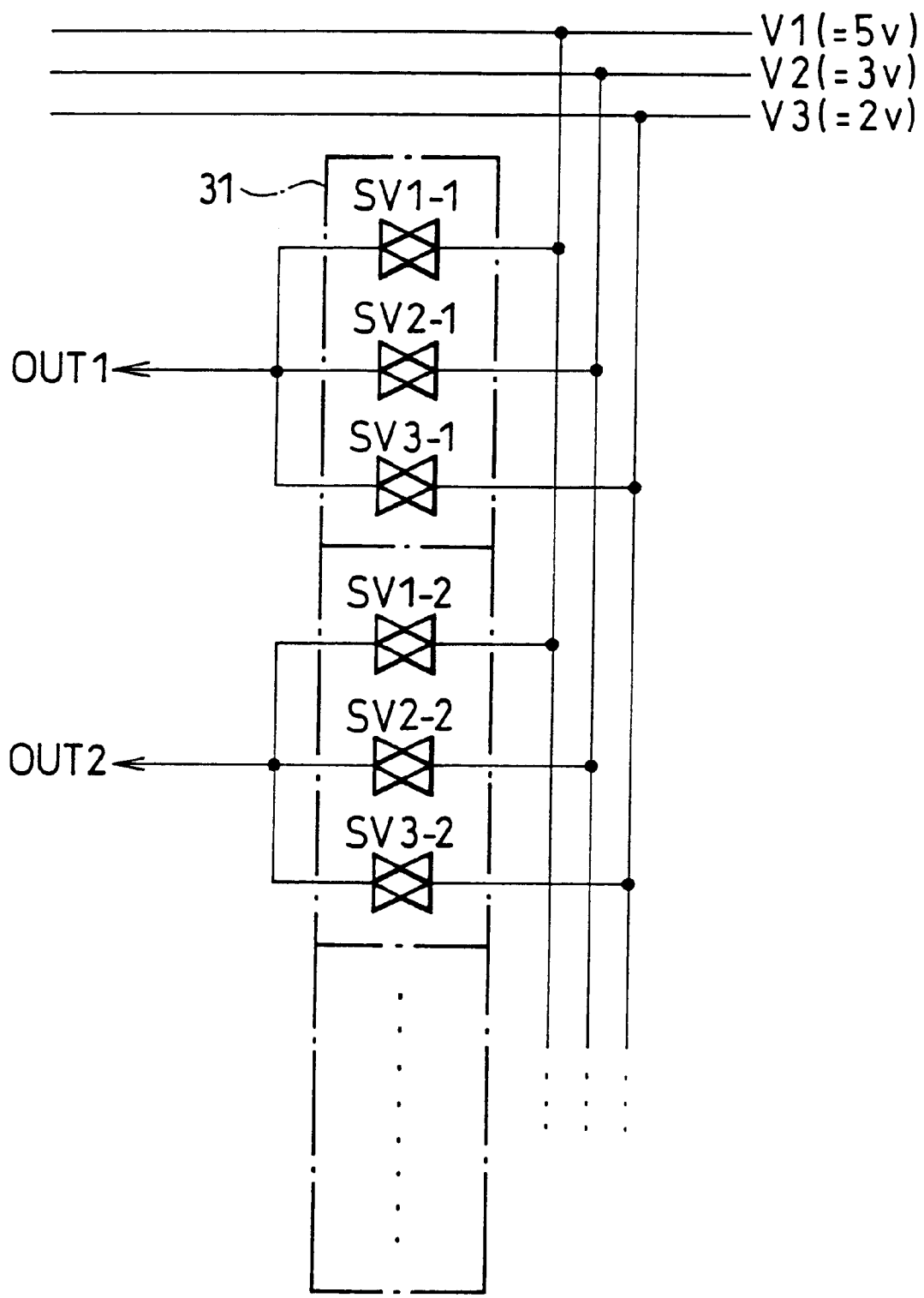
FIG. 5 shows an exemplary interface voltage supply means.
Figure 6A:
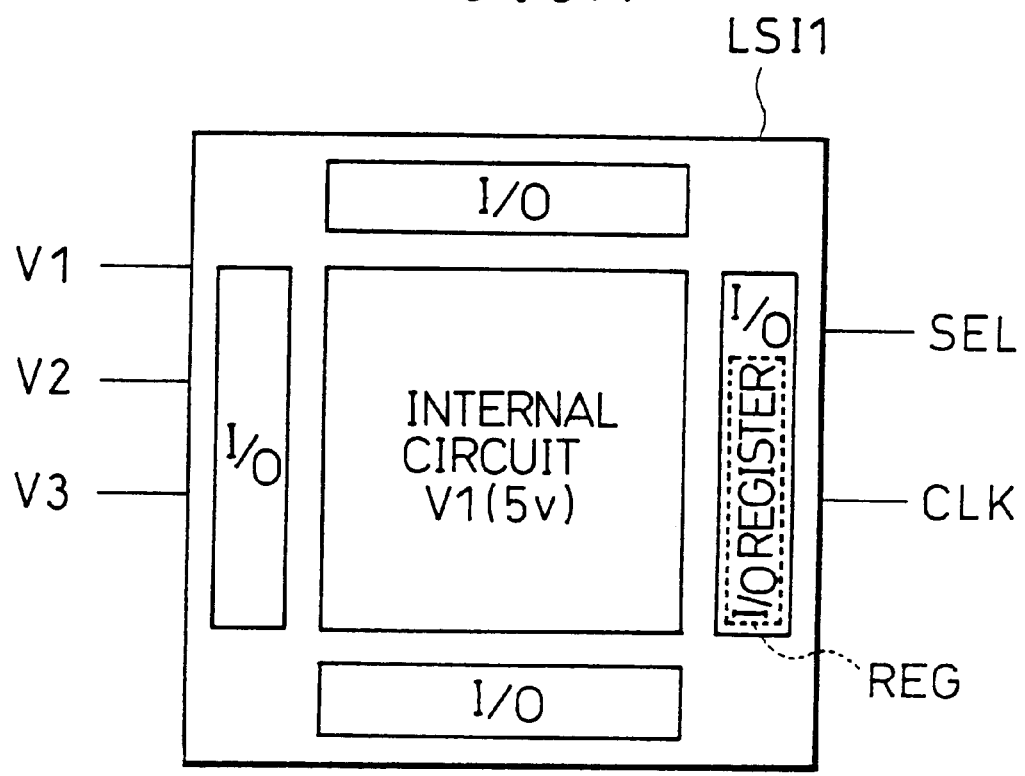
FIG. 6 shows an LSI having an I/O register and an example of operational modes stored in the I/O register.

FIG. 5 illustrates an interface voltage supply circuit shown in FIGS. 3 and 4. FIG. 6 shows how operational modes are set for the interface voltage supply circuit of FIG. 5.

As an example, take the LSI1 operating at V1. The interface voltage supply circuit 31 of FIG. 5 is designed for the LSI1 such that the interface voltage supply circuit 31 selects and outputs one of three operating voltages V1, V2, and V3. Thus, the interface voltage supply circuit 31 is provided with transistor switches Sv1-1–Sv3-2 for selecting and outputting the three operating voltages V1–V3 at the output ends OUT1, OUT2, and OUT3, respectively. Although an exemplary switching elements for output circuit is shown in FIG. 5, it would be apparent that the same switching elements may be used in the input circuit as needed.

FIG. 6 illustrates how switching modes of the interface voltage supply circuit 31 is established for LSI1.

The LSI1 is provided with three power supply terminals for receiving three operating voltages V1, V2, and V3 connected with the respective power supply lines Lv1 (for 5 Volts), Lv2 (for 3 Volts), and Lv3 (for 2 Volts). The LSI1 is also provided with an I/O resistor REG in the I/O circuit, together with a select pin SEL and a select clock pin CLK therefor for connection with an external device.

Figure 6B:
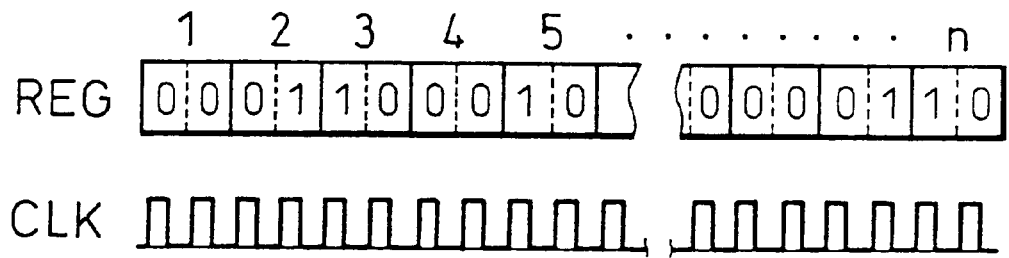

Switching modes in the form of serial data each associated with corresponding one of the output voltages are entered in the I/O register REG from the select pin SEL in synchronism with the clock entered at the clock pin CLK. In this way, the switching modes are stored in the I/O register REG for all the outputs (n outputs say) of the LSI. The switching modes may be assigned to a set of different binary data such as {0, 0}, {0, 1} and {1, 0} associated with the respective operating voltages V1, V2, and V3, as shown in FIG. 6B. The operating voltages can be selected and output to the corresponding output ends OUT1, OUT2, and OUT3 by actuating the respective switches Sv1-1–Sv3-2 of FIG. 5, in accordance with the binary data retrieved from the register REG.

Thus, by registering a serial data representing the switching modes in the I/O register REG, an arbitrary number of modes may be stored in the I/O register without adding pins for selecting the modes. If a need arises to change the number of the operating voltages, it can be done easily by externally rewriting the data stored in the I/O register REG.

If it is preferred not to add any pin for setting the switching modes, the I/O register REG of FIG. 6 may be replaced by a storage device such as a ROM or RAM to store the switching modes.

Desired switching modes can be imprinted in the substrate using appropriate aluminum masks and contact masks during the manufacturing processes for the LSIs.

Figure 7:
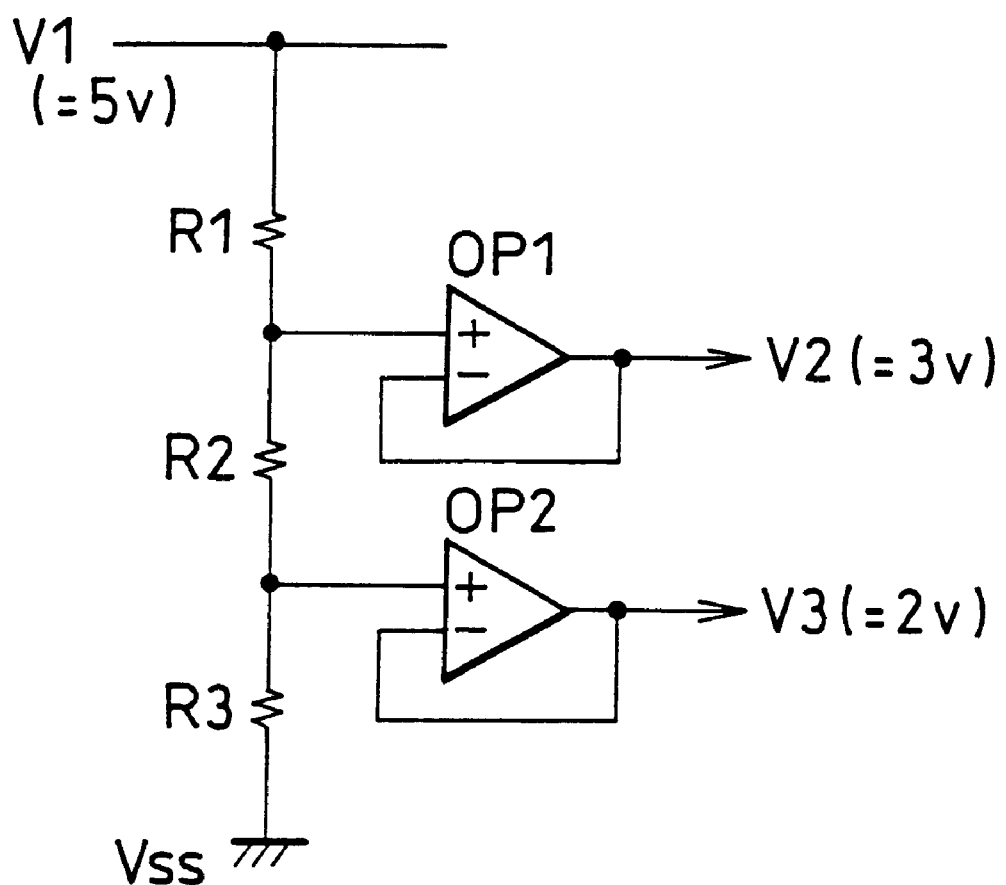
FIG. 7 shows an example of an internal voltage generator of an LSI.

FIG. 7 shows a circuit for establishing operating voltages (referred to as operating voltage generator) which can be used in place of the interface voltage supply circuit shown in FIG. 5, especially when all the power supply lines are not entirely available to a given LSI1.

The operating voltage generator comprises resistors R1, R2, and R3 connected in series between the v1 line and the Vss line, as shown in FIG. 7. Operating voltages V2 (3 Volts) and V3 (2 Volts) may be obtained from the nodes of the resisters R1 and R2 via a voltage follower circuit OP1 and from the nodes of the resisters R2 and R3 via a voltage follower circuit OP2, respectively.

With this operating voltage generator, any operating voltage, V2, V3, besides its own operating voltage V1, may be internally generated, so that no extra pin is needed to externally obtain necessary operating voltages.

What is claimed is:

1. An electronic apparatus comprising:

a multiplicity of operably connected semiconductor integrated circuits (ICs) arranged on a substrate which operate at different operating voltages, wherein all the interface voltages between operably connected ICs are the lowest operating voltage; and each of said ICs other than those operating at the lowest operating voltage is provided with:

an input circuit for converting the lowest operating voltage of a signal input thereto from another IC to its own operating voltage; and an output circuit for converting the voltage of the signal to be output therefrom to the lowest operating voltage.

2. An electronic apparatus comprising:

a multiplicity of operably connected semiconductor integrated circuits (ICs) arranged on a substrate which operates at different operating voltages, wherein the interface voltage between any two operably connected ICs operating at two operating voltages is the lower operating voltage of the two; and each of said ICs other than those operating at the lower operating voltage is provided with:

an input circuit for converting a lower operating voltage of a signal input thereto from another IC to its own operating voltage; and an output circuit for converting the voltage of the signal to be output therefrom to a required lower operating voltage.

* * * * *